United States Patent [19]

Petroff et al.

[11] Patent Number: 4,586,068
[45] Date of Patent: Apr. 29, 1986

[54] SOLID STATE PHOTOMULTIPLIER

[75] Inventors: Michael D. Petroff, Fullerton; Maryn G. Stapelbroek; William A. Kleinhans, both of Santa Ana, all of Calif.

[73] Assignee: Rockwell International Corporation, El Segundo, Calif.

[21] Appl. No.: 539,878

[22] Filed: Oct. 7, 1983

[51] Int. Cl.[4] .................... H01L 27/14; H01L 31/00
[52] U.S. Cl. ........................................................ 357/30
[58] Field of Search ......................................... 357/30

[56] References Cited

U.S. PATENT DOCUMENTS 4,301,592 11/1981 Lin ......................................... 357/30

OTHER PUBLICATIONS

Bratt, Impurity Germanium and Silicon Infrared Detectors, in Semiconductors and Semimetals, vol. 12, p. 85, (R. Willardson ed. 1977).
Efros, et al., Impurity Conductivity in Low Compensated Semiconductors, Phys. Stat. Sol. (b), vol. 50, p. 45 (1972).
Kasuya, A Theory of Impurity Conduction I, J. Phys. Soc. Japan, vol. 13, p. 1096 (1958); Kasuya, et al., A Theory of Impurity Conduction II, J. Phys. Soc. Japan, vol. 13, p. 1287 (1958).
Miller, et al., Impurity Conduction at Low Concentrations, Phys. Rev., vol. 120, p. 745 (1960).
Mott, The Metal-Insulator Transition in Extrinsic Semiconductors, Adv. Phys., vol. 21, p. 785 (1972).
Mott, et al., The Model and General Discussion of Impurity Conduction, in Theory of Impurity Conduction, Adv. Phys., vol. 10, p. 110 (1961).
Richards, et al., Infrared Detectors for Low-Background Astronomy: Incoherent and Coherent Devices for One Micrometer to One Millimeter, in Infrared and Millimeter Waves, vol. 6, p. 149 (K. Button ed. 1982).
Rose, An Analysis of Photoconductive Photon Counting, Proc. 3rd Photoconductivity Conf., p. 7 (E. Pell ed. 1969).
Stillman, et al., Avalanche Photodiodes, in Semiconductors and Semimetals, vol. 12, p. 291 (Willardson and Beers eds. 1977).
Van Lien, et al., Activation Energy of Hopping Conduction in Heavily Doped Semiconductors, Sov. Phys. Semicond., vol. 13, p. 1281 (1979).

Primary Examiner—William L. Sikes
Assistant Examiner—Robert E. Wise
Attorney, Agent, or Firm—H. Fredrick Hamann; Craig O. Malin; John J. Deinken

[57] ABSTRACT

A solid state photon detector includes a semiconducting blocking layer with sufficiently low donor and acceptor concentrations that substantially no charge transport can occur by an impurity conduction mechanism. A semiconducting buffered layer is provided with a sufficiently high donor impurity concentration to create an impurity energy band and with a sufficiently high acceptor impurity concentration that an electron cannot be injected into and drift through the layer without recombining with ionized donors. A semiconducting active layer is positioned between the blocking and buffered layers with a sufficiently high donor concentration to create an impurity energy band. The acitve layer also includes a sufficiently low acceptor impurity concentration that a photogenerated electron can drift through the active layer without recombining with ionized donors. A first electrical contact with the blocking layer collects electrons without injecting D+ charge carriers, while a second electrical contact with the buffered layer collects carriers from the impurity band. The detector is designed to operate with a sufficient electrical bias applied between the first and second contacts to raise the field at some point in the active layer to the threshold for impact ionization of donor impurities. Under appropriate conditions, such detectors are capable of detecting single photons.

34 Claims, 15 Drawing Figures

SOLID STATE PHOTOMULTIPLIER

BACKGROUND OF THE INVENTION

This invention is concerned with the detection of electromagnetic radiation, and in particular with detectors capable of detecting individual photons.

The detection of electromagnetic energy is made possible because of a series of complex interactions which occur between such energy and certain kinds of materials. These interactions enable remote sensing systems to record contrasts between an observed object and its background. In using radiation for detection, however, the dual nature of electromagnetic energy must be recognized. Electromagnetic radiation characteristically exhibits both wave and particle like behavior, with the photon model (which represents the discrete amount of energy associated with radiation at a particular wavelength) emphasizing the quantized and statistical properties of electromagnetic radiation, while a wave description of such radiation stresses overall, average effects.

One limit to the detection of electromagnetic energy is established by the uncertainty principle of quantum mechanics, which prohibits the simultaneous measurement of both the number of photons (intensity) and the phase of an electromagnetic field. A direct (incoherent) detector, however, does not measure phase, but produces an output voltage or current which is proportional to the photon flux. Hence the uncertainty principle places no restriction on the measurement of photons by a direct detector and such a detector can, in principle, be completely noiseless and detect the arrival of a single photon.

In a situation where a large amount of background radiation is present, the need for such an ideal photon counter is not acute—a detector with relatively low responsivity but unit quantum efficiency can perform as well as an ideal detector under background-limited conditions. In a low background environment, however, the fluctuations in the background radiation are so small that the responsivity of the detector becomes more important than quantum efficiency. Here the ability to count individual photons would be highly desirable. Many important applications, in fields such as astronomy and spectroscopy, involve the regime of low-background detection and would find many uses for a detector capable of counting individual photons, particularly in the infrared and longer wavelength regions of the electromagnetic spectrum. The adoption of such a detector in the space environment, for example, would create an opportunity for dramatic improvements in astronomical observations in the 1-1000 um wavelength range. See, e.g., Richards, et al., Infrared Detectors for Low-Background Astronomy: Incoherent and Coherent Devices from One Micrometer to One Millimeter, in Infrared and Millimeter Waves-Systems and Components, Vol. 6, Page 149 (K. Button ed. 1982). Unfortunately, however, the devices which have traditionally been available in the art for the detection of incoherent infrared radiation are at least two to three orders of magnitude short of the ability to count single photons. Some of the limitations of such prior art devices will be apparent from a brief review of the field.

In general, electromagnetic radiation can interact with materials by virtue of photon effects, thermal effects, or wave interactions. Of these categories, photon effects are most important in the realm of photon detection. The class of photon effects includes all interactions between incident photons and electrons within a material, whether the electrons are bound to lattice atoms or free. Photon effects may be further categorized as either internal or external. In the external or photoemissive effect, the incident photon causes an emission of an electron from the surface of the absorbing material (the photocathode). Photomultipliers utilizing this effect have been employed in astronomical detectors at wavelengths less than 1 um, where each free photoelectron may be accelerated to a high energy by an electric field and detected as a single event. These devices have not been successfully applied, however, to wavelengths significantly beyond 1 um.

An internal photon effect involves a photoexcited carrier (an electron or hole) which remains within the material. The most common types of internal effects are photoconductivity and photovoltaic effects, with photoconductivity being the most widely used. Intrinsic photoconductivity requires the excitation of a free hole-electron pair by a photon with an energy at least as great as the energy gap of the host material, while extrinsic photoconductivity involves the absorption of an incident photon at a neutral impurity center, thereby forming either a free electron or a free hole and leaving the impurity center in an ionized state. High performance intrinsic detectors suitable for low background conditions are generally available only for the wavelength region below 15-20 um, while extrinsic detectors in Si and Ge can operate at wavelengths up to 210 um. Photoconductive gains greater than one require materials with long lifetimes and devices equipped with ohmic contacts, which allow the free passage of carriers from one electrode into the semiconductor to replenish those carriers removed at the other electrode. The minimum photon rate which has been detected with internal detectors, however, is approximately 1000 photons/sec-$Hz^{\frac{1}{2}}$ with a 1 Hz bandwidth.

Photovoltaic devices comprise another common type of internal detector. The photovoltaic mechanism requires an internal potential barrier with a built-in electric field to separate a photoexcited hole-electron pair. One example of such a device is the avalanche photodiode (APD), which includes an internal gain mechanism, making it somewhat analogous to a photomultiplier but with the potential for a higher quantum efficiency and a larger bandwidth. The APD utilizes avalanche breakdown, which occurs in a p-n junction of moderate doping levels under reverse bias. In the absence of radiation, the thermally excited carriers normally present in the semiconductor are accelerated within the high field region of the junction to velocities so high that their collisions with lattice atoms transfer electrons by impact ionization from the valence to the conduction band, leaving free holes in the valence band. These freed electrons are then accelerated, collide with other atoms, and free more electron-hole pairs. Thus an avalanche of electrons occurs within the high field region of the junction.

Because avalanching can be initiated by photoexcited electrons or holes, as well as by thermally excited ones, the effect produces an increase in the number of photoexcited carriers. An avalanche photodetector, however, cannot be supplied with sufficient gain to detect single photons. This gain (the number of electrons flowing through the detector circuit per carrier generating photon) must be greater than $10^4$. (See A. Rose, An Analysis of Photoconductive Photon Counting, Proc. 3rd Photoconductivity Conf., Page 7 (E. Pell ed. 1969)). In addition, because the impact ionization effect in such a device occurs across the bandgap, the impacting electrons generate both electrons and holes, which each can cause additional electron-hole pairs by further impact ionization. As a result, an avalanche device is basically unstable and statistical variations in the impact ionization process can cause large fluctuations in the gain or multiplication of the device, contributing considerable excess noise.

Because of limitations such as those discussed above, the detectors available in the art are not capable of detecting individual photons in a wide variety of applications where such a detecting capability would be very useful and would facilitate the accomplishment of tasks which cannot be achieved with currently available devices. Such a detection technique would be well received, for example, in the field of infrared astronomy and would find immediate acceptance for use in spectroscopic techniques such as grating spectroscopy, Fourier transform spectroscopy, and Fabry-Perot interferometry.

SUMMARY OF THE INVENTION

It is a general object of this invention to provide a new photon detector. In general, this detector includes a first semiconducting region with sufficiently low first and second conductivity type impurity concentrations that substantially no charge transport can occur by an impurity conduction mechanism. A second semiconducting region is provided with a sufficiently high first conductivity type impurity concentration to create an impurity energy band. In addition, the second conductivity type impurity concentration in this region is sufficiently high that a first conductivity type carrier cannot be injected into and drift through that region without recombining with ionized first conductivity type impurities. A third semiconducting region is positioned between the first and second regions with a sufficiently high first conductivity type impurity concentration to create an impurity energy band. This region is also provided with a sufficiently low second conductivity type impurity concentration that a photogenerated first conductivity type carrier can drift through the region without recombining with ionized first conductivity type impurities. A first electrical contact with the first region collects first conductivity type carriers without injecting second conductivity type carriers, while a second electrical contact with the second region collects carriers from the impurity band. The detector is designed to operate with a sufficient electrical bias between the first and second contacts to raise the field at some point in the third region above the threshold for impact ionization of first conductivity type impurities.

In a more particular embodiment the concentration of second conductivity type impurities in the third region is high enough to establish a subregion which is not depleted of impurity band carriers under the applied bias, the bias creating a sufficiently high field for field assisted thermal ionization of charge carriers to generate a dark current through the third region and maintain a low field within the undepleted subregion.

Another more particular embodiment includes a third region wherein the concentration of second conductivity type impurities is varied to establish a high field subregion proximate the first region and a low field subregion in the remainder of the third region. The high field is above the threshold for impact ionization of first conductivity type impurities while the low field is below that threshold.

Any of these embodiments may be further enhanced by varying the concentration and species of first conductivity type impurities at different locations within the third region.

In a layered device, the second region may be referred to as a buffered layer, the third region is an active layer deposited on the buffered layer, and the first region a blocking layer deposited on the active layer. The blocking layer may be an undoped semiconducting layer. The buffered layer may act as a substrate for the device, or a substrate may be added. In the former case, the second contact may be a degenerately doped or ion implanted region in the substrate. Where a substrate is added in addition to the buffered layer, the substrate may be degenerately doped, in which case it acts as the second contact. Alternatively, the substrate may be an undoped semiconductor and the second contact degenerately doped or ion implanted into the substrate, or the second contact may be a separate layer between the substrate and the buffered layer. In any of these embodiments, the substrate, the second contact, and the buffered layer may be made transparent to incoming radiation in backside illuminated versions of the detector.

The first conductivity type impurities may be donor impurities, in which case the second conductivity type impurities are acceptor impurities, or vice versa. Silicon and germanium have been identified as particularly useful materials for employment in the semiconducting regions of the detector.

DESCRIPTION OF THE DRAWINGS

Additional features and advantages of the invention are presented in the descriptive section below, which refers to the drawings, where.

DESCRIPTION OF THE INVENTION

This invention is concerned with extrinsic detectors. It has long been understood that the concentration of impurity atoms should be made as high as possible in the active layer of such a detector to obtain the highest quantum efficiency. For the detectors available in the prior art, however, an upper limit was imposed on impurity concentration by impurity conduction effects, which appear when the electron orbits of neighboring impurity atoms begin to overlap, thereby forming an impurity band in which electronic conduction may take place without recourse to the conduction or valence bands of the semiconductor material.

The impurity conduction situation is further complicated by the various types of conduction which can occur in an extrinsic semiconductor. For convenience, the present discussion of such conduction types will focus on n type material (which contains predominantly donor impurities or defects) but, as those skilled in the art will appreciate, a similar analysis may be applied to p type material (containing predominantly acceptor impurities or defects).

Consider a semiconducting material containing a donor concentration $N_D$ and a lower acceptor concentration $N_A$ ($N_A < N_D$) which is in thermal equilibrium. Three possible donor concentration regions may be distinguished in this situation. First, at a low donor concentration, the donors and acceptors will create levels in the forbidden energy gap located between the valence band and the conduction band. If the temperature of the material is sufficiently low, all carriers will be frozen out onto impurity levels. It is well known that, under these conditions, all of the acceptors are negatively charged (and thus may be designated as A— charges) and that the concentration $N_{D+}$ of ionized donors (D+ charges) is equal to the acceptor concentration $N_A$. The concentration $N_{Do}$ of neutral (Do) donors is then equal to the difference $N_D - N_A$. It is also possible for a donor to bind two electrons (D— levels).

With such a low donor concentration, the donors are sufficiently widely spaced that the tunneling of electrons between donor sites is precluded. At the low temperatures being considered, the material may thus be considered as effectively an insulator, although current may nevertheless be carried by electrons injected into the conduction band or holes injected into the valence band. Material with a donor concentration in this region may be designated as i type material (for the purposes of explaining the present invention it is not necessary to distinguish between n type and p type in this low concentration regime). See Mott, et al., The Theory of Impurity Conduction, Advances in Physics, Vol. 10, Pp. 110–116 (1961).

The second category of donor concentration involves an intermediate concentration of donors where the distance between impurities is decreased enough that electrons on the donors can rapidly tunnel or "hop" from occupied to unoccupied donor sites. In effect, the donor levels merge into an "impurity band" which is separated in energy from the conduction band and the band formed from D— states. The term "impurity band" refers to a collection of energy levels which are contained within a forbidden energy gap or band gap of a semiconducting material. At this intermediate level of donor concentration, charge transport can occur in the material between these collective energy levels without the usual necessity of exciting the charge carriers to the valence or conduction band of the material. Such an impurity band need not necessarily be made up of true "band like" or extended energy states, but can consist of states which are localized on impurities or defects within the material. In the latter case, charge transport can occur by means of a hopping or tunnelling type of motion between the impurity or defect sites, this motion being stimulated by interactions with lattice phonons.

Because the number of empty states (D+ charges) in such an impurity band is equal to the number of compensating acceptors, two situations must be distinguished. If $\frac{1}{2}N_D < N_A < N_D$, then the impurity band is less than half full and the charge carriers in the impurity band can be regarded as negatively charged electrons. If $N_A < \frac{1}{2}N_D$, however, the charge carriers in the impurity band are the positively charged empty states or mobile D+ charges. Material fitting the latter category, where $N_D$ is in the intermediate concentration range and where $N_A < \frac{1}{2}N_D$, may be denoted as D type material.

Another type of behavior may be observed in the third category, where the donor concentration is sufficiently high to cause "metallic" or degenerate conductivity. Here the impurity band broadens in energy and overlaps the conduction and/or the D— bands. In this situation, the charge carriers can, in a certain sense, be regarded as negative electrons above the Fermi level and positive empty states below the Fermi level. Material with a sufficiently high donor concentration to exhibit such "metallic" conductivity will be denoted as n+ type material.

As mentioned above, a similar analysis can be applied to p type material, where the impurity band arises from acceptor levels. p type material with $N_A$ in the intermediate concentration range and $N_D < \frac{1}{2}N_A$ is denoted as A type material, in which the role of mobile D+ charges is assumed by negative A— charges. Furthermore, p type material containing a sufficiently high concentration of acceptors to exhibit metallic conductivity is denoted as p+ type material.

Figure 1:
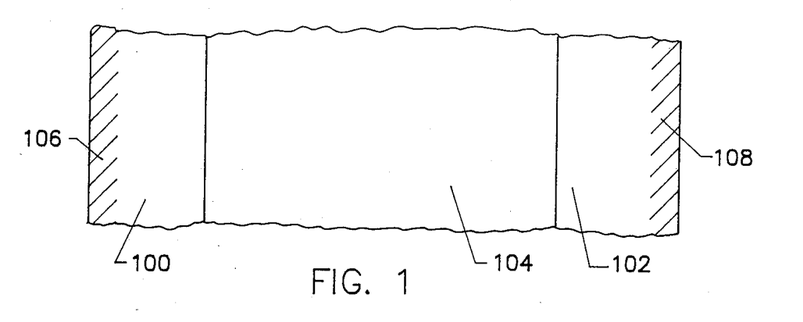
FIG. 1 is a cross sectional side view of a solid state photon detector constructed according to the present invention.

Turning now to some of the particular embodiments of this invention, FIG. 1 is a cross sectional side view depicting the elements of a solid state photon detector constructed according to the present invention. As those skilled in the art will appreciate, some of the spatial dimensions of the detector are exaggerated relative to other dimensions in the drawings in order to better explain the operation and features of the invention. Furthermore, the embodiments presented are based on n type semiconducting material, as in the analysis above, although those skilled in the art will be aware that analogous embodiments may be constructed with p type material. The detector of FIG. 1 includes a semiconducting blocking layer 100 which contains sufficiently low concentrations of donors and acceptors that substantially no charge transport can occur in this layer by an impurity conduction mechanism. A semiconducting buffered layer 102 is provided with a sufficiently high concentration of donor impurities to create an impurity energy band and with a sufficiently high acceptor concentration $N_A$ that electrons cannot be injected into and drift through the buffered layer. Electrons cannot be injected through the buffered layer because the high D+ concentration therein ($N_{D+} = N_A$) ensures that such electrons will be captured. A semiconducting active layer 104 is placed between the blocking and buffered layers, the active layer containing a sufficiently high concentration of donor impurities to create an impurity energy band. A first electrical contact 106 collects electrons from the blocking layer without injecting holes, while a second electrical contact 108 is provided for collecting D+ charges from the active layer impurity band. When an electrical bias is applied between the contacts 106 and 108, and the bias is high enough to raise the field in a sufficiently large region of the active layer above the threshold for impact ionization of donor impurities, the device can operate as a photon detector which is capable of detecting individual photons.

Figure 2:
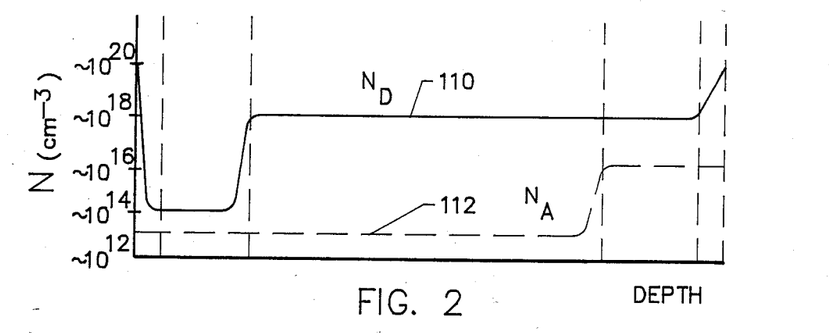
FIG. 2 is a plot of the doping profiles for the device shown in FIG. 1 fabricated in silicon.
Figure 3:
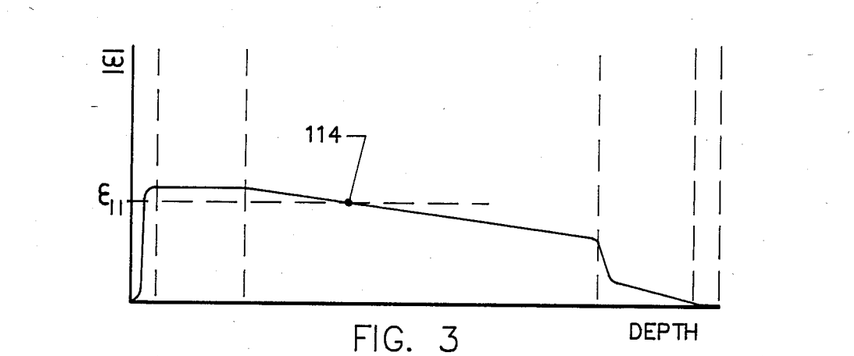
FIG. 3 is a plot illustrating the electric field distribution for the device of FIG. 1 upon the application of a proper bias voltage to the device.

FIG. 2 is a plot of the doping profiles for the donor and acceptor impurities placed in the various layers of the detector shown in FIG. 1, with the vertical axis representing the impurity concentration N per cubic centimeter. The horizontal axis represents depth in the device and corresponds in scale to the various layers shown in FIG. 1. Curve 110 indicates the concentration $N_D$ of donor impurities and curve 112 shows the concentration $N_A$ of acceptor impurities, which are calculated for a device in which the layers 100–104 are fabricated of silicon. FIG. 3 is a plot which illustrates the electric field distribution resulting in the device when an appropriate bias is applied across the contacts, with the vertical axis indicating electric field strength $|\epsilon|$ and the horizontal axis representing, as in FIG. 2, depth in the device.

Figure 4:
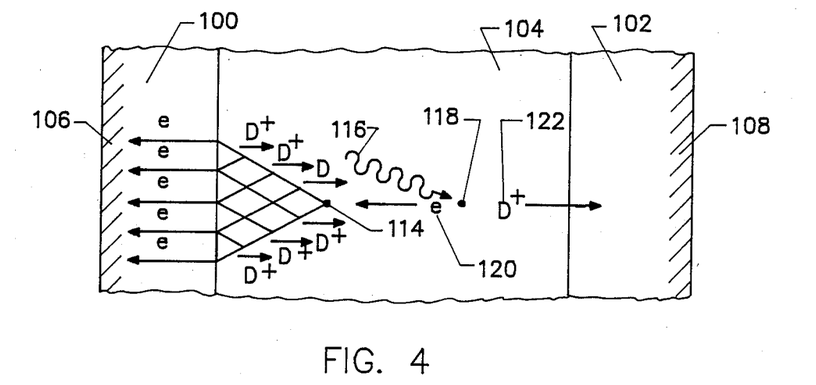
FIG. 4 is a schematic diagram in cross sectional form illustrating the operating mechanism of the FIG. 1 detector.

FIG. 4 is a diagram, partially schematic and partially in cross section, which illustrates the operating mechanism of the FIG. 1 detector. A positive voltage applied to the first contact 106 relative to the second contact 108 sets up a field in the device which, as shown in FIG. 3, is constant in the blocking layer 100 (under the assumption that the blocking layer is free of all impurities). This field decreases in the active layer 104 because the depletion of mobile D+ charge leaves a negative space charge. At a sufficiently high bias, this electric field will exceed the threshold field $\epsilon_{II}$ for impact ionization of donor impurities at some point 114 (shown in FIGS. 3 and 4) in the active layer.

When a photon 116 is absorbed at a location 118 in the active layer, a free electron 120 and a D+ charge 122 are produced. If the drifting electron reaches the point 114 before recombining with D+ charges, an avalanche of electrons may be created in the region from point 114 through the remainder of the active layer by means of impact ionization, with the number of electrons collected at the first contact 106 due to this effect potentially greater than $10^4$. The D+ charges formed in the avalanche drift to the right and are collected at the second contact 108 in times on the order of $10^{-6}$ sec for layer thicknesses on the order of 10 to 25 um (required in silicon versions of these devices). This gain mechanism can be very fast, since the time it takes electrons to travel through the active layer is very short (approximately $10^{-9}$ sec), given a field strength of at least 1000 Volts/cm. Because of the very fast response and very high gain which are inherent in the operating mechanism of this invention, the absorption of a single photon can be detected above noise using an ordinary low noise amplifier.

Figure 5:
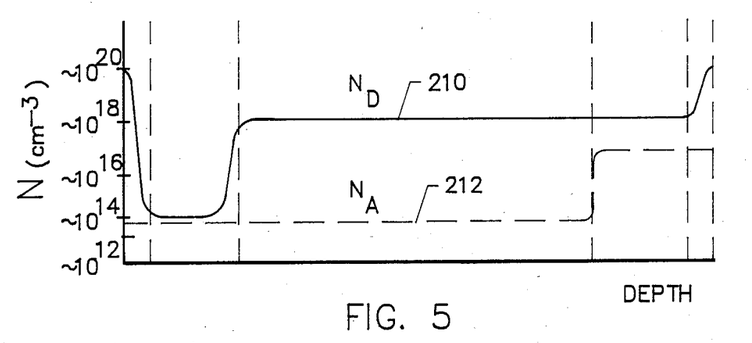
FIG. 5 is a plot of doping profiles similar to FIG. 2, but indicating a higher $N_A$ concentration, as required in an alternative embodiment of the detector.
Figure 6:
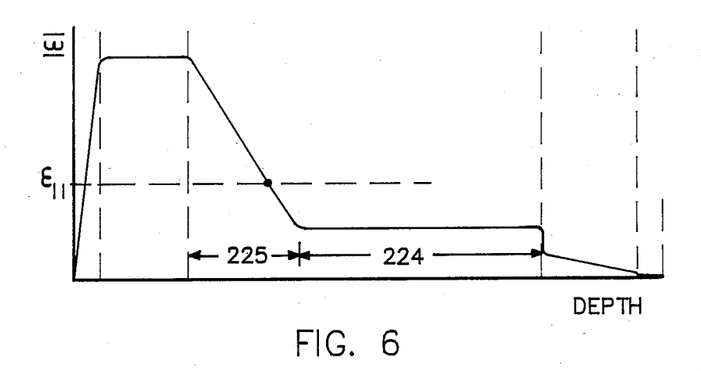
FIG. 6 is a plot of electric field for the doping profiles of FIG. 5.

In addition to the arrangement shown in FIG. 1, a variety of other embodiments may be envisioned for the unique detection mechanism which is exploited by this invention. FIG. 5, for example, depicts a doping profile similar to FIG. 2 for a device which is structurally similar to that of FIG. 1, but in this case the concentration N of acceptor impurities (curve 212) is made higher. As shown in FIG. 6, which is a plot of electric field similar to FIG. 3, the concentration of acceptor impurities is here made sufficiently high in the active layer so that impurity band carriers are not depleted in a region 224. Field assisted thermal ionization of charge carriers (the Poole-Frenkel effect) at high field strengths in the depleted region 225 generates a dark current through the active layer to maintain a low field within the undepleted region 224.

Figure 7:
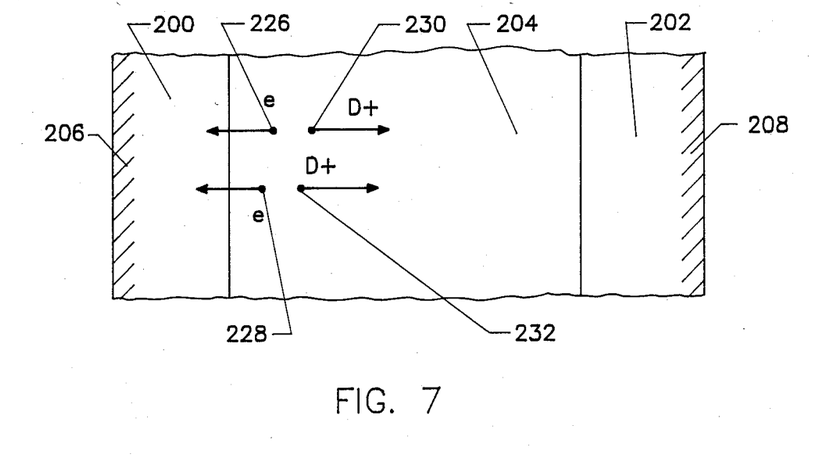
FIG. 7 is a schematic diagram in cross sectional form illustrating the operating mechanism of the FIG. 5 detector.

FIG. 7 is a schematic, cross-sectional diagram similar to FIG. 4 which depicts the operating mechanism for a device with the doping profiles shown in FIG. 5. At a sufficiently low operating temperature, free electrons, such as electrons 226 and 228, are created by field assisted thermal ionization (Poole-Frenkel effects). These electrons drift to the left through the blocking layer 200 and are collected on the first contact 206. Ionized (D+) donor charges, such as charges 230 and 232, drift to the right and are collected by the second contact 208. The resulting D+ current density J sets up a constant electric field in the undepleted part of the active layer.

Figure 8:
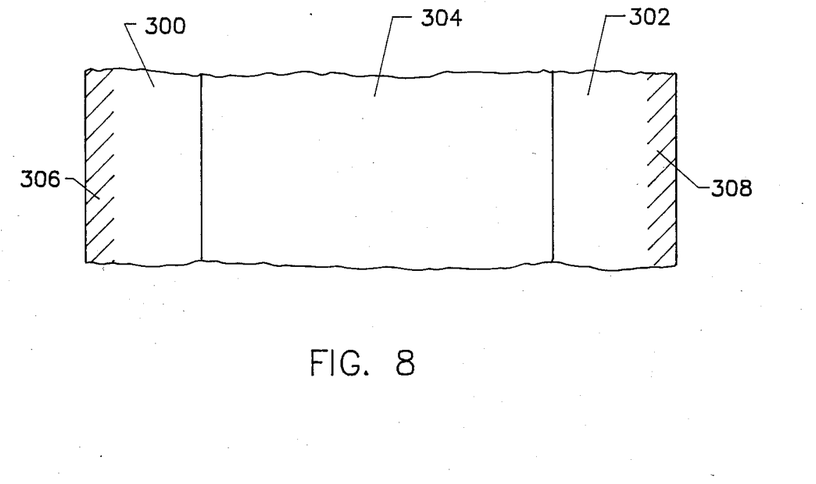
FIGS. 8, 9 and 10 are a cross sectional view, doping profile, and electric field plot for another alternative embodiment of this invention.
Figure 9:
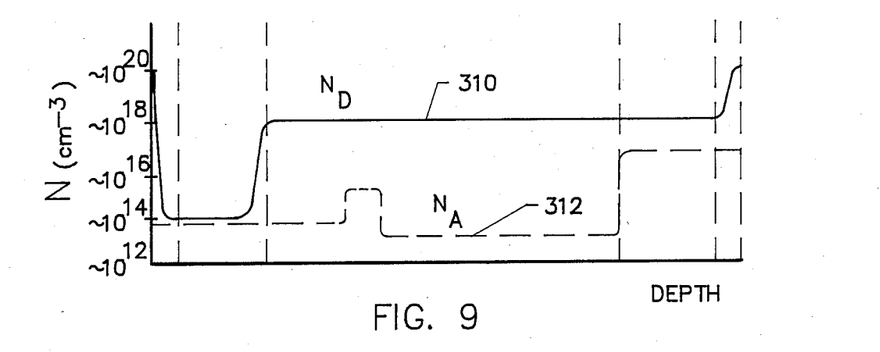
Figure 10:
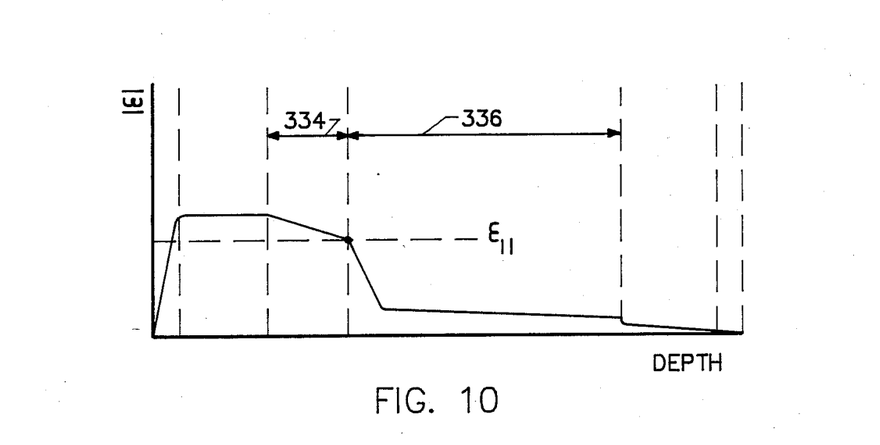

Another approach to utilizing the detection mechanism of this invention is shown in FIGS. 8–10. FIG. 8 is a cross sectional view of a detector similar to that of FIG. 1, FIG. 9 is a plot of the doping profiles for the device shown in FIG. 8, and FIG. 10 is a plot of the resulting electric field when a bias is applied across the device.

This detector includes a blocking layer 300, a buffered layer 302, an active layer 304, a first contact 306, and a second contact 308, all of which are analogous to similarly identified elements in the device of FIG. 1. As in the device of FIG. 1, the concentration $N_D$ of donor impurities, shown by curve 310 in FIG. 9, is sufficiently high in the active layer 304 to create an impurity energy band. The concentration $N_A$ of acceptor impurities, however, as shown by curve 312, is varied such that a high field region 334 (indicated in FIG. 10) is established in the portion of the active layer nearest the blocking layer and a low field region 336 is established in the portion of the active layer next to the buffered layer. The field in the region 334 rises above the threshold for impact ionization of donor impurities, while the field in the region 336 is below the threshold for impact ionization.

Figure 11:
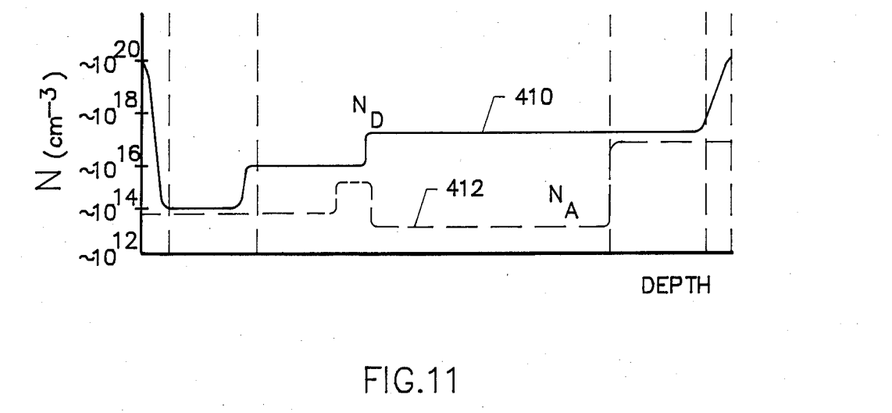
FIGS. 11 and 12 are additional doping profiles for additional embodiments of the invention.

Further refinements in the design of any of the detectors described above may be obtained by varying the concentration or species of donor impurities in the devices. FIG. 11, for example, is a doping profile similar to that shown in FIG. 9. In this embodiment, the concentration $N_A$ of acceptor impurities (curve 412) is the same as indicated in FIG. 9. The resulting electric field will thus correspond to the field shown in FIG. 10. The concentration $N_D$ of donor impurities (curve 410), however, is varied within the active layer to lower the dark current or to alter the amplitude of photon pulses.

Figure 12:
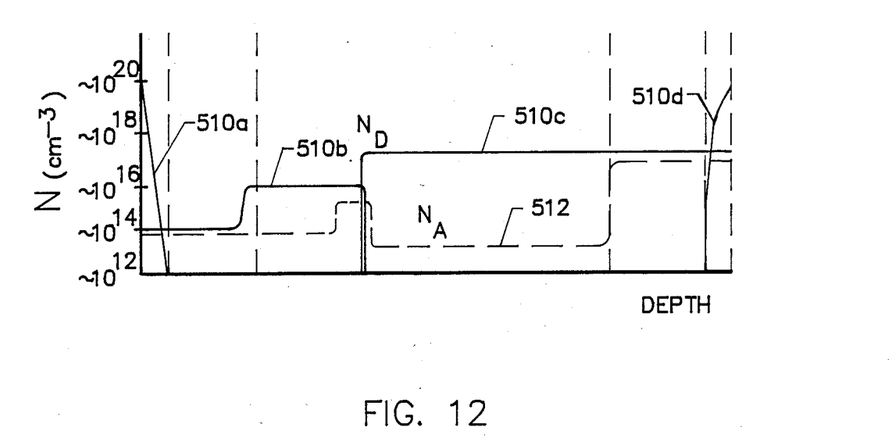

An additional enhancement may be achieved by varying the species of donor impurities which are used at different locations within the device. FIG. 12, for example, depicts a doping profiled similar to that shown in FIG. 11, with curve 512 analogous to curve 412. The donor concentrations, however, are achieved with up to four different dopants, as shown by the curves 510a, 510b, 510c, and 510d. Again, the resulting electric field will be the same as shown in FIG. 10. Different dopants are used, however, to optimize the impact ionization effect and the spectral response of the device.

As those skilled in the art will appreciate, the active layers of these detectors may be epitaxially grown on the buffered layer, and the blocking layer epitaxially grown on the active layer. Furthermore, either electrical contact may be made transparent to the incoming radiation depending upon whether the detector is to be frontside or backside illuminated.

A variety of arrangements may be utilized in fabricating the buffered layer and second contact. In the detector of FIG. 1, for example, the buffered layer 102 acts as a substrate for the device. The second contact 108 may be formed by degenerately doping a region in the buffered substrate or by ion implanting a region therein. If the device is to be backside illuminated, the buffered substrate 102 may also be made transparent.

Figure 13:
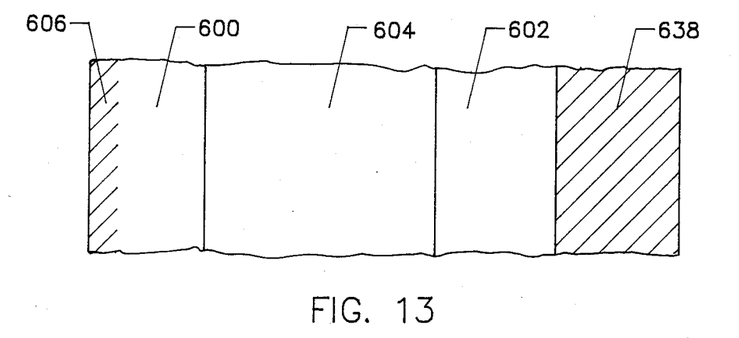
FIGS. 13, 14, and 15 are cross sectional side views similar to that of FIG. 1 depicting alternate structural arrangements for the detector of this invention.
Figure 14:
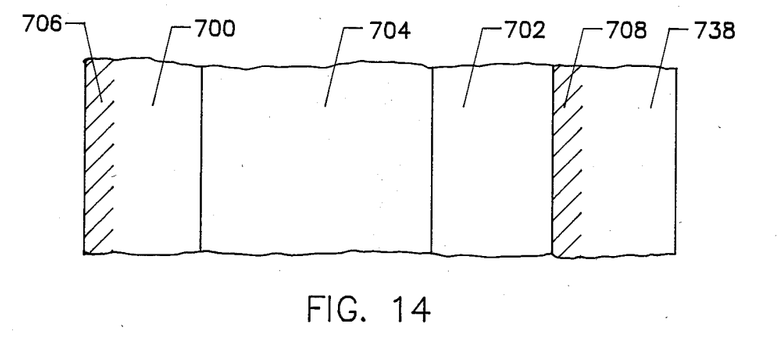
Figure 15:
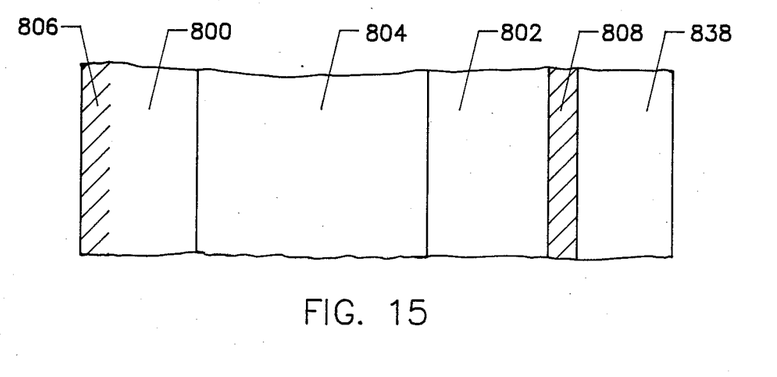

Another possibility involves a substrate which is distinct from the buffered layer. FIG. 13, for example, is a cross sectional side view of a detector, with a blocking layer 600, a buffered layer 602, an active layer 604, and a first contact 606, which may be made to function in accordance with any of the embodiments described above with respect to FIGS. 1-12. This embodiment includes in addition a substrate 638 on which the buffered layer 602 is deposited. The substrate is degenerately doped so that it serves as the second contact in this device. In FIG. 14, the detector illustrated in cross sectional side view includes a blocking layer 700, a buffered layer 702, an active layer 704, a first contact 706, a second contact 708, and an undoped substrate 738. Here the second contact 708 is a region which is either degenerately doped or ion implanted into the substrate 738. Yet another alternative is depicted in FIG. 15, the device of that drawing including a blocking layer 800, a buffered layer 802, an active layer 804, a first contact 806, a second contact 808, and an undoped substrate 838. In this embodiment, the second contact 808 is a separate layer which is deposited on the substrate between the substrate and the buffered layer 802. As mentioned above, if any of these embodiments are to be used in the backside illuminated mode, the substrate, second contact, and buffered layer, as required, may be made transparent.

As those skilled in the art will appreciate, the first conductivity type impurities used in the detectors of this invention may be donor impurities, as in the embodiments described in detail above, in which case the second conductivity type impurities will be acceptor impurities, or vice versa. Where silicon is used as the semiconducting material for such a device, the donor impurities may be selected from among arsenic, phosphorus, antimony, bismuth, and lithium, while the acceptor impurities may be chosen from boron, aluminum, gallium, or indium. Another possible semiconducting material which may be used is germanium.

In summary, this invention provides a significant improvement in the state of the art of extremely sensitive photon detectors. This advance becomes particularly apparent in comparing the devices of this invention to the types of devices which have heretofore been available in the art. An avalanche photodiode (APD), for example, utilizes the phenomenon of impact ionization, as does the present invention, but in the APD impact ionization occurs across the bandgap of the detector material. As a result, an impacting electron generates both an electron and a hole, which each can create additional electron-hole pairs by impact ionization. Consequently, the APD mechanism is basically unstable. In the detector of this invention, however, an impact ionization produces an electron and a D+ charge. Since the D+ charge cannot cause an impact ionization, the effect utilized by this invention offers the major advantage of being inherently stable. The ionized donors are also mobile and can be removed quickly.

The spectral response of practical APD detectors is limited to wavelengths shorter than about 10 um. The single photon detectors of this invention, by comparison, have been demonstrated to have a spectral response that extends to 20 um for arsenic doped silicon detectors. Antimony doped silicon detectors constructed according to this invention should have a long wavelength cutoff of about 40 um and germanium detectors might be sensitive to as far as 150 um.

A number of embodiments of the invention have been illustrated and described herein, but the novel principles of this invention are broader than these specific embodiments. In addition, modifications and additional embodiments will undoubtedly be apparent to those skilled in the art. Consequently, the examples which have been presented should be considered as illustrative rather than inclusive, with the appended claims being more indicative of the full scope of the invention.

We claim:
1. A solid state photon detector for operation under an applied electrical bias, comprising:
 a first semiconducting region with first and second conductivity type impurity concentrations which are low enough that substantially no charge transport occurs by an impurity conduction mechanism;
 a second semiconducting region with a first conductivity type impurity concentration which is high enough to create an impurity energy band and with a second conductivity type impurity concentration which is high enough that first conductivity type carriers injected into said region recombine with ionized first conductivity type impurities;
 a third semiconducting region between said first and second regions with a first conductivity type impurity concentration which is high enough to create an impurity energy band and a second conductivity type impurity concentration which is low enough that first conductivity type carriers which are photogenerated in said third region can drift through said region without recombining with ionized first conductivity type impurities;
 a first electrical contact in contact with the first region for collecting first conductivity type carriers without injecting second conductivity type carriers; and
 a second electrical contact in contact with said second region for collecting carriers from said impurity band,
 said electrical bias being applied between said contacts to raise the electric field in at least the portion of said third region adjacent said first region above the threshold for impact ionization of first conductivity type impurities.

2. The detector of claim 1, wherein the concentration of first conductivity type impurities is varied within said third region.

3. The detector of claim 2, wherein the species of first conductivity type impurities are varied within said third region.

4. The detector claim 1, wherein the concentration of second conductivity type impurities in said third region is high enough that impurity band carriers are not completely depleted in said third region and wherein said bias creates a field which is high enough that field assisted thermal ionization of charge carriers generates a dark current through said third region to maintain a low field within said undepleted subregion.

5. The detector of claim 4, wherein the concentration of first conductivity type impurities is varied within said third region.

6. The detector of claim 5, wherein the species of first conductivity type impurities are varied within said third region.

7. The detector of claim 1, wherein the concentration of second conductivity type impurities in said third region is varied such that a high field subregion is established proximate said first region and a low field subregion is established in the remainder of said third region, said high field being above the threshold for impact ionization of first conductivity type impurities and said low field being below the threshold for impact ionization of first conductivity type impurities.

8. The detector of claim 7, wherein the concentration of first conductivity type impurities is varied within said third region.

9. The detector of claim 8, wherein the species of first conductivity type impurities are varied within said third region.

10. The detector of claim 1, wherein:
said second region further comprises a buffered layer;
said third region further comprises an active layer deposited on said buffered layer; and
said first region further comprises a blocking layer deposited on said active layer.

11. The detector of claim 10, wherein said active layer is epitaxially deposited on said buffered layer and said blocking layer is epitaxially deposited on said active layer.

12. The detector of claim 10, wherein said blocking layer further comprises an undoped semiconducting layer.

13. The detector of claim 10, wherein said buffered layer further comprises a substrate.

14. The detector of claim 13, wherein said substrate is transparent.

15. The detector of claim 13, wherein said second contact further comprises a degenerately doped region in said substrate.

16. The detector of claim 13, wherein said second contact further comprises an ion implanted region in said substrate.

17. The detector of claim 10, further comprising a substrate on which said buffered layer is deposited.

18. The detector of claim 17, wherein said substrate is transparent.

19. The detector of claim 17, wherein said substrate is degenerately doped and further comprises said second contact.

20. The detector of claim 17, wherein said substrate further comprises an undoped semiconductor.

21. The detector of claim 20, wherein said second contact further comprises a degenerately doped region in said substrate.

22. The detector of claim 20, wherein said second contact further comprises an ion implanted region in said substrate.

23. The detector of claim 20, wherein said second contact further comprises a layer deposited on said substrate and between said substrate and said buffered layer.

24. The detector of claim 1, wherein said first conductivity type impurities further comprise donor impurities and said second conductivity type impurities further comprise acceptor impurities.

25. The detector of claim 24, wherein said first, second, and third regions further comprise silicon.

26. The detector of claim 25, wherein said donor impurities are selected from the group consisting of arsenic, phosphorus, antimony, bismuth and lithium, and said acceptor impurities are selected from the group consisting of boron, aluminum, gallium, and indium.

27. The detector of claim 24, wherein said first, second, and third regions further comprise germanium.

28. The detector of claim 1, wherein said first conductivity type impurities further comprise acceptor impurities and said second conductivity type impurities further comprise donor impurities.

29. The detector of claim 28, wherein said first, second, and third regions further comprise silicon.

30. The detector of claim 29, wherein said donor impurities are selected from the group consisting of arsenic, phosphorus, antimony, bismuth and lithium, and said acceptor impurities are selected from the group consisting of boron, aluminum, gallium, and indium.

31. The detector of claim 28, wherein said first, second, and third regions further comprise germanium.

32. A solid state photon detector for operation under an applied electrical bias, comprising:
a buffered layer with a first conductivity type impurity concentration which is high enough to create an impurity energy band and with a second conductivity type impurity concentration which is high enough that first conductivity type carriers injected into said layer recombine with ionized first conductivity type impurities;
an active layer epitaxially deposited on said buffered layer with a first conductivity type impurity concentration which is high enough to create an impurity energy band and a second conductivity type impurity concentration which is low enough that first conductivity type carriers which are photogenerated in said third region can drift through said active layer without recombining with ionized first conductivity type impurities;
a blocking layer epitaxially deposited on said active layer with first and second conductivity type impurity concentrations which are low enough that substantially no charge transport occurs by an impurity conduction mechanism;
an electrical contact in contact with said buffered layer opposite said active layer for collecting carriers from said impurity band; and
a transparent electrical contact in contact with said blocking layer opposite said active layer for collecting first conductivity type carriers without injecting second conductivity type carriers,
said electrical bias being applied between said contacts to raise the electric field in at least the portion of said active layer adjacent to said blocking layer above the threshold for impact ionization of first conductivity type impurities.

33. A solid state photon detector for operation under an applied electrical bias, comprising:
a buffered layer with a first conductivity type impurity concentration which is high enough to create an impurity energy band and with a second conductivity type impurity concentration which is high enough that first conductivity type carriers injected into said layer recombine with ionized first conductivity type impurities;
an active layer epitaxially deposited on said buffered layer with a first conductivity type impurity concentration which is high enough to create an impurity energy band, with a second conductivity type impurity concentration which is low enough that first conductivity type carriers which are photogenerated in said third region can drift through said active layer without recombining with ionized first conductivity type impurities but which is high enough that impurity band carriers are not depleted completely across said active layer, and wherein field assisted thermal ionization of charge carriers proximate said blocking layer generates a dark current through said action layer to maintain a low field within the undepleted region of said active layer;

a blocking layer epitaxially deposited on said active layer with first and second conductivity type impurity concentrations which are low enough that substantially no charge transport occurs by an impurity conduction mechanism;

an electrical contact in contact with said buffered layer opposite said active layer for collecting carriers from said impurity band; and a transparent electrical contact in contact with said blocking layer opposite said active layer for collecting first conductivity type carriers without injecting second conductivity type carriers, said electrical bias being applied between said contacts to raise the electric field in at least the portion of said active layer adjacent to said blocking layer above the threshold for impact ionization of first conductivity type impurities.

34. A solid state photon detector for operation under an applied electrical bias, comprising:

a buffered layer with a first conductivity type impurity concentration which is high enough to create an impurity energy band and with a second conductivity type impurity concentration which is high enough that first conductivity type carriers injected into said layer recombine with ionized first conductivity type impurities;

an active layer epitaxially deposited on said buffered layer with a first conductivity type impurity concentration which is high enough to create an impurity energy band and wherein the concentrations and species of second conductivity type impurities is varied such that a high field region is established proximate said blocking layer and a low field region is established in the remainder of said active layer, said high field being above the threshold for impact ionization of first conductivity type impurities and said low field being below the threshold for impact ionization of first conductivity type impurities, the second conductivity type impurity concentration in addition being low enough that first conductivity type carriers which are photogenerated in said third region can drift through said active layer without recombining with ionized first conductivity type impurities;

a blocking layer epitaxially deposited on said active layer with first and second conductivity type impurity concentrations which are low enough that substantially no charge transport occurs by an impurity conduction mechanism;

an electrical contact in contact with said buffered layer opposite said active layer for collecting carriers from said impurity band; and a transparent electrical contact in contact with said blocking layer opposite said active layer for collecting first conductivity type carriers without injecting second conductivity type carriers, said electrical bias being applied between said contacts to raise the electric field in at least the portion of said active layer adjacent to said blocking layer above the threshold for impact ionization of first conductivity type impurities.

* * * * *